United States Patent
Yao et al.

(10) Patent No.: US 9,531,181 B2
(45) Date of Patent: Dec. 27, 2016

(54) CURRENT SENSING CIRCUIT

(71) Applicant: Fluke Precision Measurement Ltd., Norwich, Norfolk (GB)

(72) Inventors: Hong Yao, Shanghai (CN); Chao Zhang, Shanghai (CN); Yong Yang, Shanghai (CN)

(73) Assignee: Fluke Precision Measurement Ltd., Norwich (GB)

( * ) Notice: Subject to any disclaimer, the term of this patent is extended or adjusted under 35 U.S.C. 154(b) by 0 days.

(21) Appl. No.: 14/539,446

(22) Filed: Nov. 12, 2014

(65) Prior Publication Data

US 2015/0131188 A1  May 14, 2015

(30) Foreign Application Priority Data

Nov. 13, 2013  (CN) .......................... 2013 1 0572316

(51) Int. Cl.
| | |
|---|---|
| H02H 3/08 | (2006.01) |
| H02H 3/087 | (2006.01) |
| H03F 1/52 | (2006.01) |
| G01R 19/00 | (2006.01) |
| H03F 1/30 | (2006.01) |
| H03F 3/45 | (2006.01) |

(52) U.S. Cl.
CPC ............ *H02H 3/08* (2013.01); *G01R 19/0092* (2013.01); *H03F 1/52* (2013.01); *H03F 1/30* (2013.01); *H03F 3/45475* (2013.01)

(58) Field of Classification Search
CPC ............ H02H 3/08; H02H 3/087; H02H 9/02
USPC ........................................................ 361/93.1
See application file for complete search history.

(56) References Cited

U.S. PATENT DOCUMENTS 3,979,642 A    9/1976  Cath et al.
8,031,453 B2 * 10/2011  Nelson ................. H05K 7/1462
                                               361/92
(Continued)

FOREIGN PATENT DOCUMENTS

GB    2 434 048 A    7/2007

OTHER PUBLICATIONS

Lai, C.W. et al., "High Gain Amplification of Low-Side Current Sensing Shunt Resistor", Universities Power Engineering Conference, 2008. Aupec '08. Australasian, IEEE, Piscataway, NJ, Dec. 14, 2008, pp. 1-5.

(Continued)

*Primary Examiner* — Dharti Patel
(74) *Attorney, Agent, or Firm* — Seed IP Law Group LLP

(57) ABSTRACT

A current sensing circuit comprises a first input terminal and a second input terminal for introducing a subject current from a device coupled between the first and second input terminals; a first amplifier having a first input node coupled to the first input terminal via a protection resistor, a second input node coupled to the second input terminal, and a first output node coupled to the first input node via a capacitor, wherein the first amplifier has a current sensing path for sensing the subject current and converting the subject current into an output voltage that changes with the subject current; and a protection circuit coupled between the first and second input nodes of the first amplifier, wherein the protection circuit is configured to draw a protection current from the first input terminal through the protection resistor to at least partially offset the subject current.

20 Claims, 4 Drawing Sheets

(56) References Cited

U.S. PATENT DOCUMENTS

2010/0073090 A1 3/2010 Mattos
2013/0337756 A1* 12/2013 Wilson ................ H04B 5/0037
　　　　　　　　　　　　　　　　　　　　　　455/230

OTHER PUBLICATIONS

International Search Report for EP 14 193 043.8, mailing date Apr. 8, 2015, 9 pages.

* cited by examiner

CURRENT SENSING CIRCUIT

FIELD

The present application relates to electronic measurement technology, and more particularly to a current sensing circuit.

BACKGROUND

Various measurement devices for measuring electrical parameters (such as voltage, current, and resistance) are widely used in industry and daily life. A multi-meter is a typical electronic measurement device, which is mainly used for measuring AC and/or DC voltages, currents, and resistors. A typical multi-meter generally has a pair of test leads, each having one end connected to a subject apparatus or device and the other end inserted into a corresponding jack on a panel of the multi-meter, thus electrically connecting the subject equipment to the measuring circuit in the multi-meter.

Generally, a voltage difference (i.e., burden voltage) between two input terminals of a current sensing circuit needs to be maintained within a specific range to prevent the voltage difference from affecting the subject device. However, in conventional current sensing circuits such as a current sensing circuit shown in FIG. 1, a shunt resistor 11 is coupled between two input terminals. Hence, it is difficult to use a large shunt resistor to obtain a better signal-to-noise ratio.

As shown in FIG. 1, the current sensing circuit 10 includes the shunt resistor 11, an amplifier 12, and a fuse 13. The shunt resistor 11 is connected in series with a subject device (not shown), thus converting the subject current $I_S$ into a voltage drop across the shunt resistor. Moreover, the amplifier 12 is configured as a voltage follower, with its non-inverting input node coupled to the shunt resistor 11 to sample the voltage drop, and its inverting input node coupled to an output node of the amplifier 12 to transfer the voltage drop to the output node. In the current sensing circuit 10, the fuse 13 is connected in series with the subject device and the shunt resistor 11, which is activated in case that the subject current $I_S$ exceeds a predetermined threshold to prevent damage of the current sensing circuit 10 due to the excessive current.

However, for the current sensing circuit 10 shown in FIG. 1, the burden voltage (the voltage between the two input terminals coupled to the subject device) is equal to the sum of a voltage generated according to an input impedance (including the shunt resistor 11, the fuse 13, and a wire distribution resistance $R_W$) of the current sensing circuit 10 and an input voltage of the amplifier 12. Apparently, the burden voltage of the current sensing circuit 10 increases with the subject current. Thus, the fuse 13 and the shunt resistor 11 in the current sensing circuit 10 should be as small as possible. However, it is difficult to obtain a high signal-to-noise ratio if the shunt resistor 11 having a small resistance is used in the current sensing circuit 10.

FIG. 2 shows another typical current sensing circuit 20. As shown in FIG. 2, the current sensing circuit 20 includes a shunt resistor 21, an amplifier 22, and a fuse 23. The shunt resistor 21 is coupled in a feedback loop of the amplifier 22, i.e., between an inverting input node and an output node of the amplifier 22. Thus, the shunt resistor 21 does not affect the burden voltage between the two input terminals of the current sensing circuit 20. The burden voltage is mainly determined according to the voltage drop across the fuse 23 and the wire distribution resistor, which are generated by the subject current flowing therethrough. However, the fuse 23 generally has a non-negligible resistance, and the voltage drop across the fuse 23 may significantly affect the burden voltage if the subject current is large. Thus, the current sensing circuit 20 still needs to use a fuse having small impedance, therefore, it is not suitable for measuring large currents.

SUMMARY

An objective of the present application is to provide a current sensing circuit having a relatively large current measuring range and a small burden voltage.

In one aspect, the present application provides a current sensing circuit including a first input terminal and a second input terminal for introducing a subject current from a device coupled between the first and second input terminals; a first amplifier having a first input node coupled to the first input terminal via a protection resistor, a second input node coupled to the second input terminal, and a first output node coupled to the first input node via a capacitor; wherein the first amplifier has a current sensing path for sensing the subject current and converting the subject current into an output voltage that changes with the subject current; and a protection circuit coupled between the first and second input nodes of the first amplifier, wherein the protection circuit is configured to draw a protection current from the first input terminal through the protection resistor to at least partially offset the subject current.

In certain embodiments, the protection current has a magnitude in proportion to that of the subject current when the subject current is less than or equal to a predetermined threshold, and the protection current reaches a maximum magnitude when the subject current exceeds the predetermined threshold.

In certain embodiments, the protection circuit includes a second amplifier having a first input node coupled to a reference line via a first resistor, a second input node coupled to the second input node of the first amplifier, and a second output node coupled to the first input node of the first amplifier via a second resistor; a first feedback path coupled between the first input node of the second amplifier and the second output node; and a voltage clamping circuit coupled in parallel with the first feedback path, wherein the voltage clamping circuit is configured to clamp a voltage difference across the first feedback path.

In certain embodiments, the first feedback path includes a voltage divider for dividing the voltage difference across the first feedback path into a divided voltage difference, and applying the divided voltage difference across the second resistor to generate the protection current.

In certain embodiments, the voltage divider at least includes a third resistor and a fourth resistor coupled in series.

In certain embodiments, the voltage clamping circuit includes a first diode of a first direction, and a second diode of a second direction opposite to the first direction and coupled in parallel with the first diode.

In certain embodiments, the first amplifier further includes a second feedback path including an over-current protection device coupled between the first input terminal and the first output node of the first amplifier.

In certain embodiments, the over-current protection device is a fuse.

In certain embodiments, the fuse is a resettable fuse.

In certain embodiments, the fuse is a positive temperature coefficient thermistor.

In certain embodiments, the current sensing path includes a shunt resistor coupled between the second input node of the first amplifier and a reference line for generating the output voltage in response to the subject current, and an output terminal coupled to the second input node of the first amplifier for outputting the output voltage.

The foregoing description has outlined, rather broadly, features of the present application. Additional features of the present application will be described, hereinafter, which form the subject matter in support of the claims of the present application. It should be appreciated by those skilled in the art that the concepts and specific embodiments disclosed herein may be readily utilized as a basis for modifying or designing other structures or processes for carrying out the objectives of the present application. It should also be realized by those skilled in the art that such equivalent constructions do not depart from the spirit and scope of the present application as set forth in the appended claims.

DESCRIPTION OF THE DRAWINGS

The aforementioned features and other features of the application will be further described in the following paragraphs by referring to the accompanying drawings and the appended claims. It will be understood that these accompanying drawings merely illustrate certain embodiments in accordance with the present application and should not be considered as a limitation to the scope of the present application. Unless otherwise specified, the accompanying drawings need not be proportional, and similar reference characters generally denote similar elements.

DETAILED DESCRIPTION

The following detailed description refers to the accompanying drawings as a part of the present application. The illustrative embodiments described in the detailed description, the accompanying drawings and the claims are not limiting, and other embodiments may be adopted, or modifications may be made without deviating from the spirit and subject of the application. It should be understood that the various aspects of the application described and graphically presented herein may be arranged, replaced, combined, divided, and designed in many different configurations, and these different configurations are implicitly comprised in the application.

Figure 1:
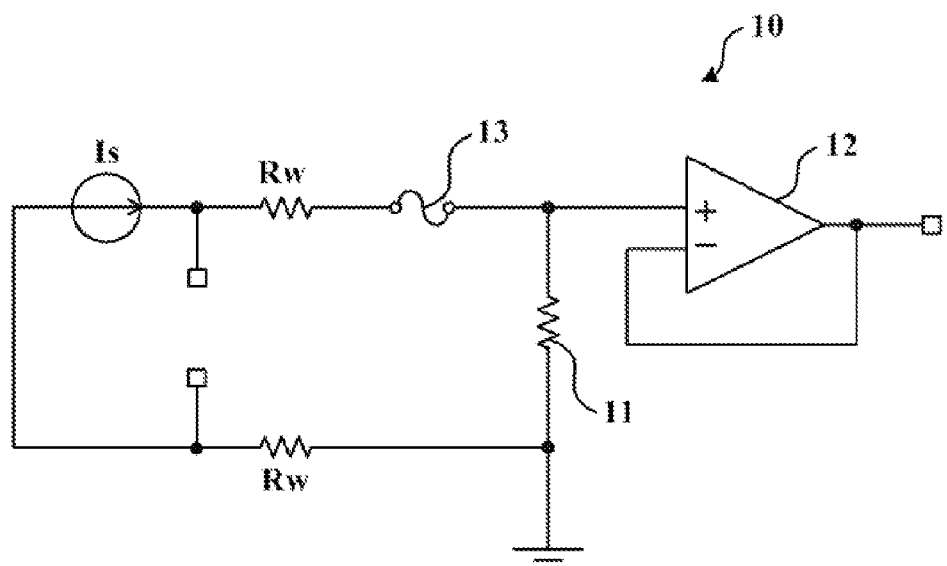
FIG. 1 shows a conventional current sensing circuit.
Figure 2:
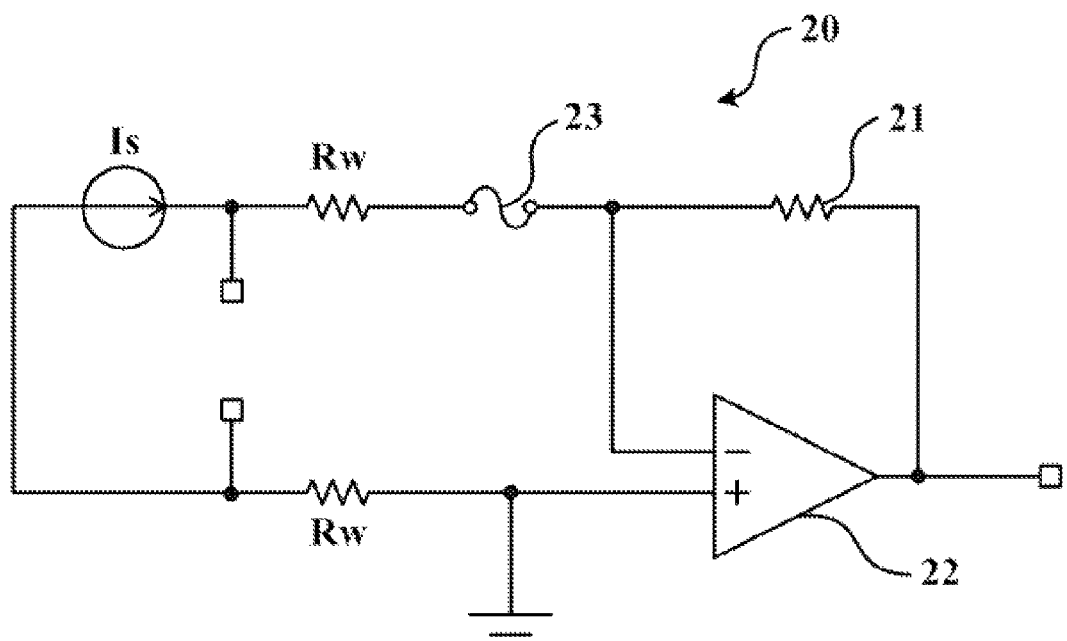
FIG. 2 shows another conventional current sensing circuit.
Figure 3:
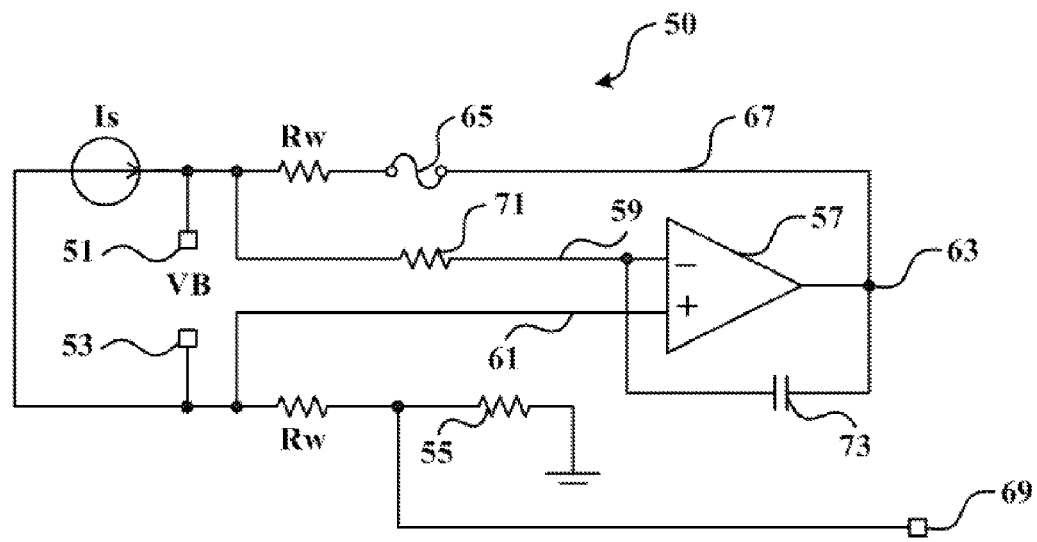
FIG. 3 shows a current sensing circuit according to an embodiment of the present application.

FIG. 3 shows a current sensing circuit 50 according to an embodiment of the present application. As shown in FIG. 3, the current sensing circuit 50 includes:

a first input terminal 51 and a second input terminal 53 for introducing a subject current $I_S$ flowing in a current path;

a shunt resistor 55 coupled in the current path for converting the subject current $I_S$ into an output voltage difference across the shunt resistor 55;

an amplifier 57 having a first input node 59 coupled to the first input terminal 51, a second input node 61 coupled to the second input terminal 53, an output node 63, and a feedback path 67 having an over-current protection device 65, wherein the feedback path 67 is coupled between the output node 63 and the first input terminal 51; and an output terminal 69 coupled to the second input terminal 53 and the shunt resistor 55 to output the output voltage difference $V_D$.

The current sensing circuit 50 further includes a protection resistor 71 and a capacitor 73. The protection resistor 71 is coupled between the first input terminal 51 and the first input node 59, and the capacitor 73 is coupled between the first input node 59 of the amplifier 57 and the output node 63.

In the current sensing circuit 50 shown in FIG. 3, the amplifier 57 is an operational amplifier. The first input node 59 is an inverting input node of the operational amplifier and the second input node 61 is a non-inverting input node of the operational amplifier. As the first input node 59 is coupled to the first input terminal 51, the feedback path 67 is coupled between the output node 63 of the amplifier 57 and the first input node 59, therefore, the amplifier 57 works in the negative feedback mode. According to the "virtual short-circuit" feature of an operational amplifier, the voltages at two input nodes of an ideal operational amplifier (whose input offset voltage is zero) operating in the negative feedback mode are equal with each other. Therefore, the voltage difference between the first input node 59 and the second input node 61 is close to zero, and is equal to an input offset voltage $V_{OS}$ of the operational amplifier. For most operational amplifiers, the input offset voltage $V_{OS}$ is of a very small magnitude, e.g., dozens to hundreds of microvolts (which depends on the structure and feature of the operational amplifiers). Furthermore, the first input terminal 51 and the second input terminal 53 are directly connected to the input nodes 59 and 61 of the amplifier 57, respectively. Therefore, the voltage difference between the first input terminal 51 and the second input terminal 53, i.e., the burden voltage $V_B$ of the current sensing circuit 50, is equal to the input offset voltage $V_{OS}$ of the operational amplifier. Also, the "virtual short-circuited" first input node 59 and second input node 61 significantly reduce the input resistance of the current sensing circuit 50.

As the input impedance at the input nodes of the operational amplifier is relatively large, there may be substantially no current flowing into or from the amplifier 57 through the first input node 59 and the second input node 61. Hence, when a subject device (not shown) is coupled to the current sensing circuit 50 and the subject current $I_S$ flowing through the subject device is generated, the subject current $I_S$ further flows through the shunt resistor 55 and the over-current protection device 65. In other words, the shunt resistor 55, the over-current protection device 65 are coupled in the current path of the subject current $I_S$ and in series with the subject device. Assuming that the subject current $I_S$ flows in the current direction shown in FIG. 3, then the subject current $I_S$ flows from a reference line (e.g., the ground), successively through the shunt resistor 55, the subject device (through the second input terminal 53 and the first input terminal 51), the over-current protection device 65 and the output node 63 of the amplifier 57, and back to the reference line through the output node 63 and the power supply.

In addition, as there is no current flowing into or from the amplifier 57 through the input nodes of the amplifier 57, the wire between the first input node 59 and the first input terminal 51 and the wire between the second input node 61 and the second input terminal 53 do not have current flowing therein. Therefore, the parasitic resistor of the two wires will not affect generating the voltage drop, i.e., will not affect the burden voltage $V_B$.

It can be seen that since the burden voltage $V_B$ of the current sensing circuit 50 is irrelevant to the voltage drop across the shunt resistor 55, the over-protection device 65 and the wire parasitic resistor $R_W$ generated by the subject current $I_S$ compared with the conventional current sensing circuits, the current sensing circuit 50 can use a shunt resistor having a relatively large resistance to obtain a high gain (corresponding to the resistance of the shunt resistor 55). It helps to improve the signal-to-noise ratio of the current sensing circuit 50 within the full range of current measurement.

The inventors of the application have found that a substantially large current may be generated by the current sensing circuit 50 when it is used to measure a voltage source having a very small output resistance, for example, when the first input terminal 51 and the second input 53 of the current sensing circuit 50 are short-circuited. In this case, as there is an input offset voltage $V_{OS}$ between the first input node 59 and the second input node 61 of the operational amplifier 57, the entire input offset voltage $V_{OS}$ will be substantially applied across the protection resistor 71 such that a current may continuously flow through the protection resistor 71. The current flowing through the protection resistor 71 will flow into the capacitor 73 through the first input node 59 to charge the capacitor 73, thus the voltage at the output node 63 of the operational amplifier 57 may be elevated uni-directionally, which further increases the current flowing between the first input terminal 51 and the output node 63 of the first amplifier 57. If the output impedance of the subject voltage source is low enough, the current may increase to make the output voltage of the first amplifier 57 saturate or to activate the over-current protection device 65 due to the excessive current. Therefore, the current sensing circuit 50 may not operate stably in certain situations.

Figure 4:
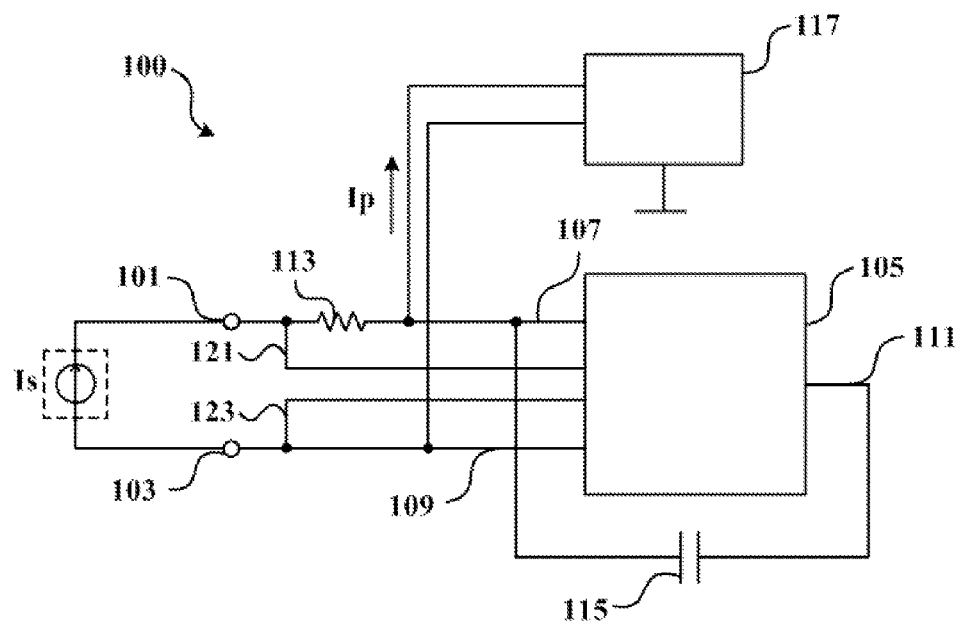
FIG. 4 shows a current sensing circuit according to another embodiment of the present application.

FIG. 4 illustrates a current sensing circuit 100 according to another embodiment of the present application. This current sensing circuit 100 can be used as a signal sampling circuit of a current measurement device (e.g., a multi-meter) to convert a double-ended input subject current signal into a single-ended output voltage signal, which can be further converted into, for example, a digital signal indicating the magnitude of the subject current by a post-stage circuit (e.g., an analog-digital conversion circuit).

As shown in FIG. 4, the current sensing circuit 100 includes:

a first amplifier 105 having a first input node 107 coupled to the first input terminal 101 via a protection resistor 113, a second input node 109 coupled to the second input terminal 103, and a first output node 111 coupled to the first input node 107 via a capacitor 115; wherein the first amplifier 105 has a current sensing path (not shown) for sensing the subject current $I_S$ and the current sensing path can convert the subject current $I_S$ into an output voltage $V_{OUT}$ that changes with the subject current $I_S$;

a protection circuit 117 coupled to the first input node 107 of the first amplifier 105, wherein the protection circuit 117 is configured to draw a protection current $I_P$ from the first input node 107 of the first amplifier 105 to at least partially offset the subject current $I_S$.

In the embodiment shown in FIG. 4, the first amplifier 105 is coupled to the input terminals 101 and 103 via wires 121 and 123, respectively, so that the current sensing path can be connected in series with the subject device to introduce the subject current $I_S$ into the current sensing path.

In certain embodiments, the first amplifier 105 is an operational amplifier, the first input node 107 is an inverting input node, and the second input node 109 is a non-inverting node.

The first amplifier 105 and the protection circuit 117 are coupled to the first input terminal 101 and the second input terminal 103, respectively, to sample the voltage difference between these two input terminals. The first amplifier 105 can generate the subject current $I_S$ according to the sampled voltage difference, and the protection circuit 117 can generate the protection current $I_P$ according to the sampled voltage difference as well. In certain embodiments, the protection current $I_P$ and the subject current $I_S$, which both relate to the voltage difference between the first input terminal 101 and the second input terminal 103, are in proportion to each other. For example, the magnitude of the protection current $I_P$ may be positively proportional to the magnitude of the subject current $I_S$.

Generally, there is typically an input offset voltage $V_{OS}$ between the two input nodes 107 and 109 of the first amplifier 105. When a subject device (not shown) having a very low output impedance is coupled between the two input terminals 101 and 103 of the circuit 100 or the two input terminals 101, 103 are short-circuited with each other, the input offset voltage $V_{OS}$ may generate a current flowing through the protection resistor 113. Specifically, the current sensing path of the first amplifier 105 is typically coupled in series with the subject device, thus the amplifier 105 can introduce the subject current $I_S$ into the current sensing path and the current sensing path converts the subject current into a corresponding voltage. Moreover, the protection circuit 117 is coupled to the first input node 107 and the power supply as well. Thus, the protection circuit 117 can provide a current path from the first input node 107 to the power supply to bypass the current in the current sensing path. As described above, the current bypassed by the protection circuit 117 may be a portion or the entire of the current flowing in the current sensing path (i.e., the subject current $I_S$) of the current sensing circuit, and the remaining portion (if any) of the subject current $I_S$ still flows in the original current path of the first amplifier 105. In certain embodiments, for example, when the subject current $I_S$ exceeds a predetermined threshold, the protection path can only bypass a portion of the subject current $I_S$. In other embodiments, for example, when the subject current $I_S$ is smaller than the predetermined threshold, the protection path can bypass a portion or the entirety of the subject current $I_S$.

In certain embodiments, the first amplifier 105 further includes a current path coupled in series with the current sensing path, and such current path can utilize an over-current protection device such as a fuse to avoid damage of the circuit 100 due to the subject current $I_S$ exceeding a specific magnitude (particularly in the case without the protection circuit 117). Therefore, the protection circuit 117 is equivalently coupled in parallel with the current path having the over-current protection device, and both are further coupled in series with the current sensing path. As a result, the subject current $I_S$ flowing through the current sensing path will be distributed between these two parallelly coupled paths.

The voltage difference between the input terminals 101 and 103 depends on the voltage drop across the protection resistor 113, which is generated by the protection current, and the input offset voltage $V_{OS}$ of the first amplifier 105. The voltage difference is equal to the vector sum of the voltage drop across the protection resistor 113 and the input offset voltage $V_{OS}$. The voltage difference between the first input terminal 101 and the second input terminal 103 is the burden voltage $V_B$ of the current sensing circuit 100. In certain embodiments, when the subject current $I_S$ exceeds a predetermined threshold, the protection current $I_P$ reaches its maximum magnitude. Accordingly, the voltage drop across the protection resistor 113 generated by the protection current has a maximum magnitude. Therefore, the protection current $I_P$ having the maximum magnitude can maintain the burden voltage $V_B$ of the current sensing circuit 100 within a specific range to avoid elevating the burden voltage $V_B$ by the excessive protection current $I_P$ and affecting the operation of the subject device.

It can be seen that in the current sensing circuit 100 in FIG. 4, when the input terminals 101 and 103 of the current sensing circuit 100 are short-circuited or close to be short-circuited, the circuit 100 can use the protection circuit 117 to bypass the subject current $I_S$ having a large magnitude in a short time to prevent the excessive current flowing into the capacitor 115. As a result, it can be avoided to generate the subject current $I_S$ of an excessive magnitude in the current sensing circuit 100. Therefore, the above current sensing circuit 100 has better stability and reliability.

Figure 5:
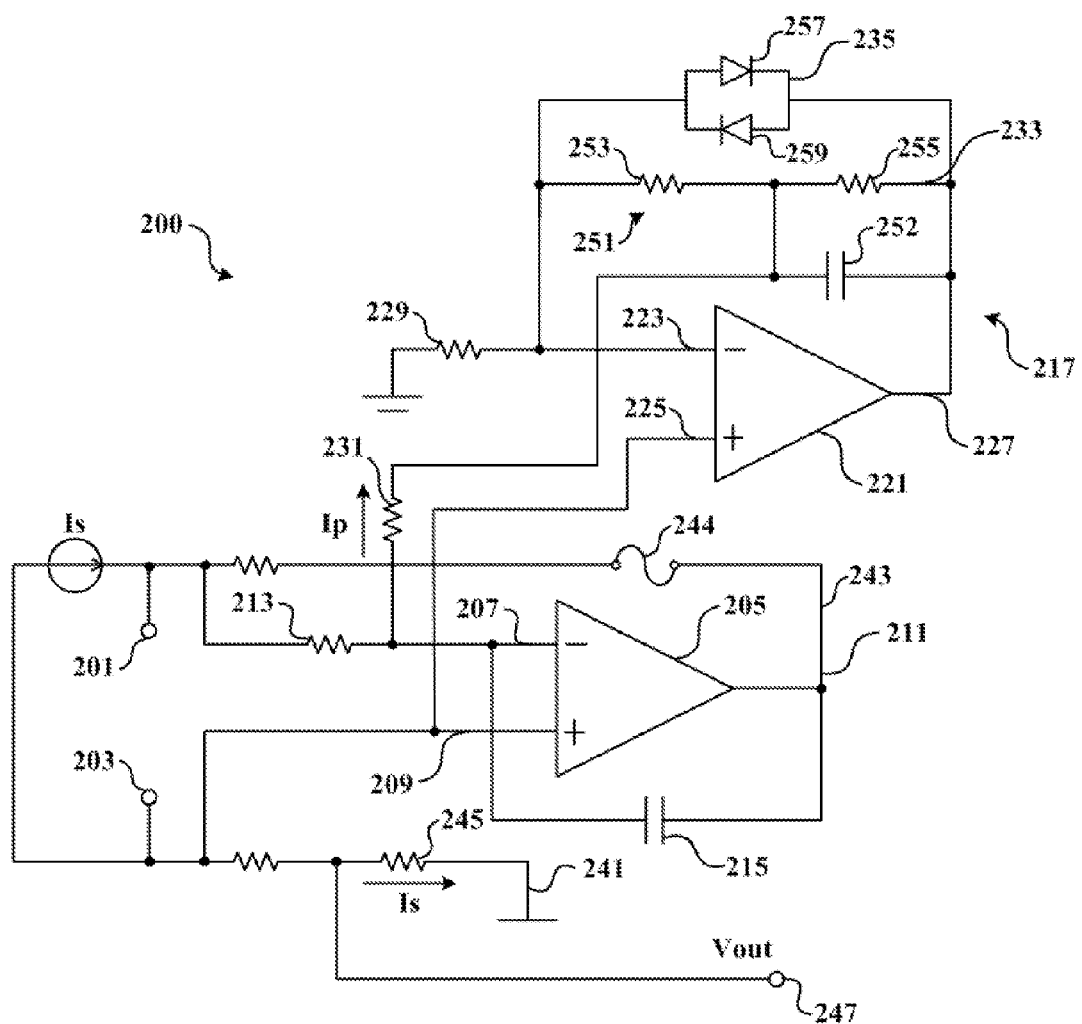
FIG. 5 shows a sensing circuit according to yet another embodiment of the present application.

FIG. 5 shows a current sensing circuit 200 according to another embodiment of the present application.

As shown in FIG. 5, the current sensing circuit 200 includes:

a first input terminal 201 and a second input terminal 203 for introducing a subject current $I_S$ from a subject device coupled between the first input terminal 201 and second input terminal 203;

a first amplifier 205 having a first input node 207 coupled to the first input terminal 201 via a protection resistor 213, a second input node 209 coupled to the second input terminal 203, and a first output node 211 coupled to the first input node 207 via a capacitor 215, wherein the first amplifier 205 has a current sensing path 241 for sensing the subject current $I_S$ and converting the subject current $I_S$ into an output voltage $V_{OUT}$ that changes with the subject current $I_S$; and a protection circuit 217 coupled between the first input node 207 of the first amplifier 205, wherein the protection circuit 217 is configured to draw a protection current $I_P$ from the first input node 207 to at least partially offset the subject current $I_S$.

The protection circuit 217 further includes a second amplifier 221 having a first input node 223 coupled to a reference line via a first resistor 229, a second input node 225 coupled to the second input node 209 of the first amplifier 205, and a second output node 227 coupled to the first input node 207 of the first amplifier 205 via a second resistor 231; a first feedback path 233 coupled between the first input node 223 of the second amplifier 221 and the second output node 227; and a voltage clamping circuit 235 coupled in parallel with the first feedback path 233, wherein the voltage clamping circuit 235 is configured to clamp a voltage difference across the first feedback path 233.

In certain embodiments, the current sensing path 241 includes a shunt resistor 245 coupled between the second input node 209 of the first amplifier 205 and the reference line for generating the output voltage $V_{OUT}$ in response to the subject current $I_S$, and an output terminal 247 coupled to the second input node 209 of the first amplifier 205 for outputting the output voltage $V_{OUT}$.

In certain embodiments, the first amplifier 205 is an operational amplifier, the first input node 207 is an inverting input node, and the second input node 209 is a non-inverting node. Thus, when the subject device (not shown) is connected to the current sensing circuit 200 and the subject current $I_S$ flowing through the subject device is generated stably, the subject current $I_S$ further flows through the shunt resistor 245. In other words, the shunt resistor 245 is coupled in series in the current path of the subject current $I_S$ as the current sensing path of the first amplifier 205. It can be seen that the subject current $I_S$ flows through the shunt resistor 245 and generates the output voltage $V_{OUT}$ across the shunt resistor 245 whose magnitude is substantially positively proportional to the magnitude of the subject current $I_S$. In certain embodiments, the shunt resistor 245 is coupled between the output terminal 247 and the reference line (such as the ground). Thus, the output voltage $V_{OUT}$ is converted into a single-ended output voltage signal.

In the embodiment shown in FIG. 5, the current sensing circuit 200 further includes a second feedback path 243 having an over-current protection device 244. The second feedback path 243 is coupled between the first input terminal 201 and a first output node 211 of the first amplifier 205. Therefore, the subject current $I_S$ flows in the second feedback path 243, or flows through the protection resistor 213 into the protection circuit 217.

The over-current protection device 244 can be switched on or off according to the current flowing therethrough. Specifically, when the current flowing through the over-current protection device 244 is relatively small, the over-current protection device 244 is equivalent to a small resistor that may substantially not affect the measurement of the subject current $I_S$. When the current flowing through the over-current protection device 244 exceeds a rated maximum current of the over-current protection device 244, the over-current protection device 244 may be activated and switch off the second feedback path 243 so that the subject current $I_S$ cannot flow into the reference line through the second feedback path 243 and the first output node 211 of the first amplifier 205. In this case, the current sensing circuit 200 cannot measure current effectively. In certain embodiments, the over-current protection device 244 is a fuse such as a resettable fuse. In certain embodiments, the fuse may be a positive temperature coefficient thermistor. In certain other embodiments, the fuse may be made of lead-antimony alloy.

The second feedback path 243 is coupled in parallel with the protection circuit 217, and the parallelly coupled second feedback path 243 and protection circuit 217 are further coupled in series with the current path of the subject current $I_S$. Therefore, the subject current $I_S$ can be distributed between the second feedback path 243 and the protection circuit 217. In certain embodiments, when the subject current $I_S$ is smaller than a predetermined threshold, the protection circuit 217 can draw the protection current $I_P$ that is positively proportional to the subject current $I_S$. Thus, the voltage difference between the first input terminal 201 and the second input terminal 203 can be maintained within a predetermined range, and the voltage difference depends on the subject current $I_S$. In this case, a portion of the subject current $I_S$ is drawn by the protection circuit 217, and the remaining portion is still bypassed by the second feedback path 243. However, when the subject current $I_S$ exceeds the predetermined threshold, the protection current $I_P$ drawn by the protection circuit 217 reaches a maximum magnitude so that the current flowing through the protection resistor 213 cannot increase. Accordingly, the voltage difference between the first input terminal 201 and the second input terminal 203 does not change with the subject current $I_S$, instead, the voltage difference is maintained at the maximum magnitude of the predetermined range, i.e., equals to the vector sum of the input offset voltage $V_{OS}$ of the first amplifier 205 and the voltage drop across the protection resistor 213 (generated by the protection current $I_P$ having the maximum magnitude).

In certain embodiments, the second amplifier 221 is an operational amplifier. Accordingly, the first input node 223 is an inverting input node and the second input node 225 is a non-inverting input node. Thus, the second amplifier 221 operates in a non-inverting amplifying mode. Specifically, the first resistor 229 and the first feedback path 233 are coupled in series between the reference line and the second output node 227 of the second amplifier 221. When the voltage drop across the first feedback path 233 is smaller than a turn-on voltage of the voltage clamping circuit 235 (i.e., a clamping voltage), the entire current flowing through the first resistor 229 will also flow in the first feedback path 233, generating the voltage difference across the first feedback path 233 (i.e., between the first input node 223 of the second amplifier 221 and the second output node 227). In addition, the second input node 209 of the first amplifier 205 is connected to the second input node 225 of the second amplifier 221. According to the "virtual short-circuit" feature of an operational amplifier, the voltage at the first input node 207 of the first amplifier 205 is substantially equal to that at the second input node 209, and the voltage at the first input node 223 of the second amplifier 221 is substantially equal to that at the second input node 225. Therefore, the voltages at the input nodes of the first amplifier 205 and the second amplifier 221 are substantially equal to each other.

In certain embodiments, the first feedback path 233 includes a voltage divider 251 for dividing the voltage difference across the first feedback path 233 to obtain an intermediate voltage difference $V_M$, and to apply the intermediate voltage difference $V_M$ across the second resistor 231 to generate the protection current $I_P$. For example, the voltage divider 251 may include at least a third resistor 253 and a fourth resistor 255 that are coupled in series with each other. In this case, the voltage at one node of the first feedback path 233 is equal to the voltage at one node of the second resistor 231, and the voltage at the other node of the first feedback path 233 is applied through the voltage divider 251 to the other node of the second resistor 231. In this case, the second resistor 231 can be connected to the second output node 227 through the capacitor 252. The capacitor 252 is used for frequency compensation of the circuit.

It should be understood that in certain embodiments, the first feedback path 233 may include at least one resistor rather than the voltage divider. Thus, one node of the second resistor 231 is directly coupled to the second output node 227 of the second amplifier. In this case, the voltage difference across the first feedback path 233 is directly applied to the second resistor 231 to generate the protection current $I_P$ flowing through the second resistor 231.

In certain embodiments, the voltage clamping circuit 235 of the protection circuit 217 includes a first diode 257 and a second diode 259 that are coupled in parallel with each other. The first diode 257 has a first direction and the second diode 259 has a second direction opposite to the first direction. Thus, the voltage clamping circuit 235 can clamp the voltage difference across the first feedback path 233, thereby clamping the intermediate voltage difference $V_M$. Specifically, when the voltage difference across the first feedback path 233 is smaller than a forward turn-on voltage of diodes, both the diodes 257 and 259 are turned off, the entire current flowing through the first resistor 229 further flows through the first feedback path 233. However, when the voltage difference across the first feedback path 233 exceeds the forward turn-on voltage of diodes (typically 0.7 V), one of the first diode 257 and the second diode 259 may be turned on, thus limiting the intermediate voltage difference $V_M$ across the first feedback path 233 within the magnitude of the forward turn-on voltage.

Specifically, when the subject current $I_S$ is small (i.e., the current flowing through the first resistor 229 is small) and does not make the voltage clamping circuit 235 activate to clamp the intermediate voltage difference, the magnitude of the intermediate voltage difference $V_M$ depends on the current flowing through the first resistor 229, thus the intermediate voltage difference $V_M$ satisfies the following equation (1):

$$V_M = \left(\frac{V_{OUT}}{R_1}\right) R_3 \qquad (1)$$

wherein $V_{OUT}$ denotes the output voltage across the shunt resistor 245 that is generated by the subject current $I_S$ flowing therethrough, $R_1$ denotes the resistance of the first resistor 229, and $R_3$ denotes the resistance of the third resistor 253 in the first feedback path 233.

In the embodiment shown in FIG. 5, the voltage at the first input node 207 of the first amplifier 205 is equal to that at the first input node 223 of the second amplifier 221. Therefore, the voltage difference $V_{R2}$ across the second resistor 231 is equal to the intermediate voltage difference $V_M$, which satisfies the following equation (2):

$$V_{R2} = \left(\frac{V_{OUT}}{R_1}\right) R_3 \qquad (2)$$

wherein $V_{OUT}$ denotes the output voltage across the shunt resistor 245 that is generated by the subject current $I_S$ flowing therethrough, $R_1$ denotes the resistance of the first resistor 229, and $R_3$ denotes the resistance of the third resistor 253 in the first feedback path 233.

Therefore, the protection current $I_P$ satisfies the following equation (3):

$$I_P = \frac{V_{OUT} R_3}{R_1 R_2} \qquad (3)$$

wherein $V_{OUT}$ denotes the output voltage across the shunt resistor 245 that is generated by the subject current $I_S$, $R_1$ denotes the resistance of the first resistor 229, $R_3$ denotes the resistance of the third resistor 253 in the first feedback path 233, and $R_2$ denotes the resistance of the second resistor 231.

When a voltage source having a very low output impedance is coupled between the first input terminal 201 and the second input terminal 203 (e.g., the two terminals are short-circuited), there will be a constant voltage difference $\Delta V$ between the first input terminal 201 and the first input node 207. The constant voltage difference $\Delta V$ will generate a current flowing through the protection resistor 213. Moreover, when the protection current $I_P$ and the protection resistor 213 have the same current magnitude with opposite directions (with reference to the first input node 207), the current sensing circuit 200 reaches to a stable state. Accordingly, the relationship between the output voltage $V_{OUT}$ and the constant voltage difference $\Delta V$ satisfies the following equation (4):

$$V_{OUT} = \Delta V \frac{R_1 R_2}{R_3 R_5} \qquad (4)$$

wherein $R_5$ denotes the resistance of the protection resistor 213. Thus, when a voltage source is coupled between the input terminals 201 and 203, the subject current $I_S$ generated in the circuit 200 is under control.

As described before, when the subject current $I_S$ exceeds a predetermined threshold, the voltage clamping circuit 235 coupled in parallel with the first feedback path 233 will limit the intermediate voltage difference $V_M$. In this case, the voltage provided by the first feedback loop 233 and applied across the second resistor 231 has a maximum magnitude, thus the protection current $I_P$ generated by the protection circuit 217 flowing through the second resistor 231 has a maximum magnitude. For the embodiment shown in FIG. 5, the maximum magnitude $I_{P,\ max}$ of the protection current $I_P$ satisfies the following equation (5):

$$I_{P,max} = \left(\frac{V_{TH}}{R_2}\right)\beta \qquad (5)$$

wherein $V_{TH}$ denotes the clamping voltage of the voltage clamping circuit 235, which is equal to, for example, the forward turn-on voltage of the first diode 257 and the second diode 259. It should be understood that in certain embodiments, the first diode 257 and the second diode 259 may have different forward turn-on voltages. In this case, the voltage clamping circuit 235 may have different clamping voltage in two different directions. $R_2$ denotes the resistance of the second resistor 231. $\beta$ denotes the voltage ratio of the voltage divider 251. In the embodiment, $\beta = R_3/(R_3+R_4)$, wherein $R_3$ denotes the resistance of the third resistor 253, and $R_4$ denotes the resistance of the fourth resistor 255.

It can be seen that when the subject current $I_S$ exceeds the predetermined threshold and the protection current $I_P$ reaches its maximum magnitude, the protection circuit 217 can only draw a portion of the current flowing through the first input node 207 from the protection resistor 213, and the remaining current still flows into the capacitor 215. If the subject current $I_S$ continues to increase and exceeds a rated current of the over-current protection device 244, the over-current protection device 244 is switched off to protect the first amplifier 205 and other circuit elements.

For the current sensing circuit 200, when the subject current $I_S$ is smaller than the predetermined threshold, the protection circuit 217 substantially increases the input impedance between the first input terminal 201 and the second input terminal 203. Specifically, when the subject current $I_S$ is small so that the voltage clamping circuit 235 is not activated, the input resistance $Z_1$ of the current sensing circuit 200 can be represented by the following equation (6):

$$Z_{ini} = \frac{R_3 R_5 R_S}{R_1 R_2} \qquad (6)$$

wherein $R_1$ denotes the resistance of the first resistor 229, $R_2$ denotes the resistance of the second resistor 231, $R_3$ denotes the resistance of the third resistor 253, $R_5$ denotes the resistance of the protection resistor 213, and $R_S$ denotes the resistance of the shunt resistor 245.

From equation (6) it is clear that the input resistance can be adjusted by changing the resistance of $R_2$. For example, the input resistance can be increased by reducing the resistance of $R_2$. Therefore, when the subject current $I_S$ is relatively small and when the protection current $I_P$ does not reach its maximum magnitude, the input impedance of the current sensing circuit 200 may be relatively high.

On the other hand, the protection circuit 217 will not increase the input impedance of the current sensing circuit 200 in measuring a relatively large subject current $I_S$ (the protection current $I_P$ reaches its maximum magnitude). Specifically, when the subject current $I_S$ is relatively large and the voltage clamping circuit 251 is activated to clamp the voltage across the first feedback path 233, for example, when the first diode 257 or the second diode 259 is turned on, the first feedback path 233 is equivalent to be coupled in parallel with a small resistor having a resistance much smaller than the third resistor 253 and the fourth resistor 255. In this case, the input resistance $Z_{ini}$ of the current sensing circuit 200 can be represented by the following equation (7):

$$Z_{ini} = \frac{\beta R_d R_5 R_S}{R_1 R_2} \qquad (7)$$

wherein $R_1$ denotes the resistance of the first resistor 229, $R_2$ denotes the resistance of the second resistor 231, $R_5$ denotes the resistance of the protection resistor 213, $R_S$ denotes the resistance of the shunt resistor 245, and $R_d$ denotes the forward turn-on resistance of the first diode 257 and the second diode 259. The forward turn-on resistance of diodes is generally small, and the voltage ratio of the voltage divider 251 can be set as a relatively small value. As a result, the input impedance of the current sensing circuit 200 can be small.

Furthermore, the burden voltage $V_B$ between the first input terminal 201 and the second terminal 203 can be represented by the following equation (8):

$$V_B = \beta V_f \frac{R_5}{R_2} \qquad (8)$$

wherein $V_f$ denotes the forward turn-on voltage of the first and second diodes, $R_2$ denotes the resistance of the second resistor 231, $R_5$ denotes the resistance of the protection resistor 213, $\beta$ denotes the voltage ratio of the voltage divider 251. In some examples, the burden voltage can be reduced by reducing the voltage ratio of the voltage divider 251.

It can be seen that as the burden voltage $V_B$ of the current sensing circuit 200 is irrelevant to the voltage drop across the shunt resistor 245 and the over-current protection device 244 that are generated by the subject current $I_S$ flowing therethrough, and the current sensing circuit 200 can use the shunt resistor 245 having a relatively large resistance to increase its gain (corresponding to the resistance of the shunt resistor 245), thereby improving the signal-to-noise ratio of the current sensing circuit 200 within the full range of current measurement.

Figure 6:
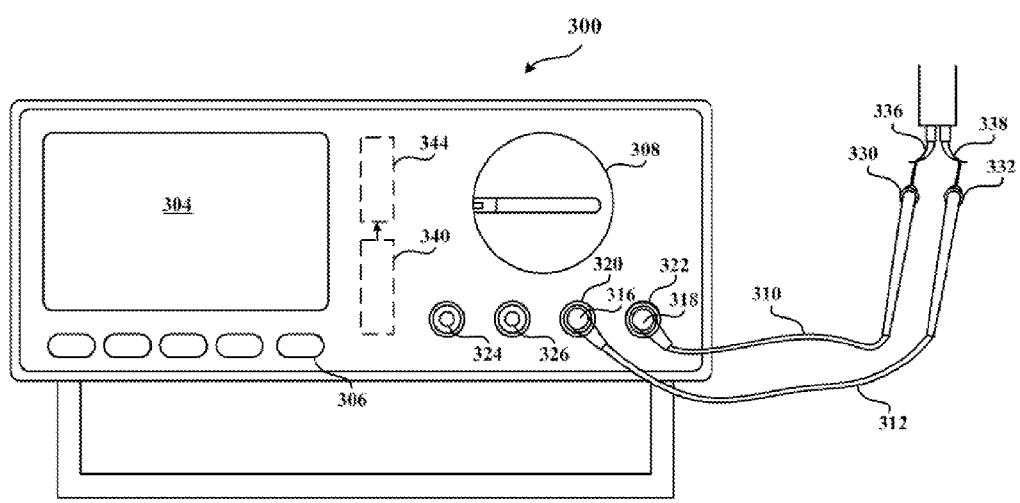
FIG. 6 shows a measurement device according to another embodiment of the present application.

FIG. 6 shows a multi-meter 300 using the current sensing circuit 100 or 200. It should be understood that the current sensing circuit of the present application can also be used in other measurement devices.

As shown in FIG. 6, the multi-meter 300 includes a digital display 304, a manually operable 306 and a rotatable mode selecting switch 308. The mode selecting switch 308 is shown in a position for measuring current. Although the multi-meter 300 uses the digital display 304, it should be understood that it can also use other types of display such as an analog meter. Similarly, selectors other than the button 306 and the selecting switch 308 can be used. A pair of test wires 310, 312 has plugs 316 and 318, respectively. These two plugs 316 and 318 are plugged into jacks 320, 322 of the multi-meter 300 and connected to the two input terminals of a current sensing circuit 340, respectively. The jacks 324 and 326 can also be used to insertion of one of the jacks 316 or 318 to measure resistance, voltage, or other electrical parameters in coordination with the selection of the mode selecting switch 308. The test wires 310 and 312 further have a first test lead 330 and a second test lead 332, respectively, which are connected to test points 336 and 338 on the subject device, respectively. Then the subject device is connected to the current sensing circuit 340 through the test wires 310 and 312. The two test leads introduce into the current sensing circuit 340 a subject current flowing in a current path. The output terminal of the current sensing circuit 340 is connected to a post-stage processing circuit 344 of the multi-meter 300, which processes an output voltage difference that is output by the current sensing circuit 340 and further provides the result to the display 304 where it is displayed as a digital readout.

It should be noted that, although several modules or sub-modules of the circuit have been described in the previous paragraphs, such division is exemplary and not mandatory. Practically, according to the embodiments of the present application, the functions and features of two or more modules described above may be embodied in one module. On the other hand, the function and feature of any one module described above may be embodied in two or more modules.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope. The scope and spirit of the present application is defined by the appended claims.

The embodiments of the invention in which an exclusive property or privilege is claimed are defined as follows:

1. A current sensing circuit, comprising:
   a first input terminal and a second input terminal for introducing a subject current from a device coupled between the first and second input terminals;
   a first amplifier having a first input node coupled to the first input terminal via a protection resistor, a second input node coupled to the second input terminal, and a first output node coupled to the first input node via a capacitor, wherein the first amplifier has a current sensing path for sensing the subject current and converting the subject current into an output voltage that changes with the subject current, and wherein the first amplifier further comprises a feedback path comprising an over-current protection device coupled between the first input terminal and the first output node of the first amplifier; and
   a protection circuit coupled between the first and second input nodes of the first amplifier, wherein the protection circuit is configured to draw a protection current from the first input terminal through the protection resistor to at least partially offset the subject current, and wherein the protection circuit is coupled in parallel with the feedback path, and the parallelly-coupled feedback path and protection circuit are further coupled in series with the current sensing path.

2. The current sensing circuit of claim 1, wherein the protection current has a magnitude in proportion to that of the subject current when the subject current is less than or equal to a predetermined threshold, and the protection current reaches a maximum magnitude when the subject current exceeds the predetermined threshold.

3. The current sensing circuit of claim 1, wherein the feedback path is a second feedback path, and wherein the protection circuit comprises:
   a second amplifier having a first input node coupled to a reference line via a first resistor, a second input node coupled to the second input node of the first amplifier, and a second output node coupled to the first input node of the first amplifier via a second resistor;
   a first feedback path coupled between the first input node of the second amplifier and the second output node; and
   a voltage clamping circuit coupled in parallel with the first feedback path, wherein the voltage clamping circuit is configured to clamp a voltage difference across the first feedback path.

4. The current sensing circuit of claim 3, wherein the first feedback path comprises a voltage divider, and the voltage divider is configured to divide the voltage difference across the first feedback path into a divided voltage difference, and apply the divided voltage difference across the second resistor to generate the protection current.

5. The current sensing circuit of claim 4, wherein the voltage divider comprises at least a third resistor and a fourth resistor coupled in series.

6. The current sensing circuit of claim 3, wherein the voltage clamping circuit comprises:
   a first diode of a first direction; and
   a second diode of a second direction opposite to the first direction and coupled in parallel with the first diode.

7. The current sensing circuit of claim 1, wherein the over-current protection device is a fuse.

8. The current sensing circuit of claim 7, wherein the fuse is a resettable fuse.

9. The current sensing circuit of claim 8, wherein the fuse is a positive temperature coefficient thermistor.

10. The current sensing circuit of claim 1, wherein the current sensing path comprises:
    a shunt resistor coupled between the second input node of the first amplifier and a reference line for generating the output voltage in response to the subject current; and
    an output terminal coupled to the second input node of the first amplifier, and configured to output the output voltage.

11. A current sensing circuit, comprising:
    a first input terminal and a second input terminal for introducing a subject current from a device coupled between the first and second input terminals;
    a first amplifier having a first input node coupled to the first input terminal via a protection resistor, a second input node coupled to the second input terminal, and a first output node coupled to the first input node via a capacitor, wherein the first amplifier has a current sensing path for sensing the subject current and converting the subject current into an output voltage that changes with the subject current; and a protection circuit coupled between the first and second input nodes of the first amplifier, wherein the protection circuit is configured to draw a protection current from the first input terminal through the protection resistor to at least partially offset the subject current, and wherein the protection circuit comprises:
  a second amplifier having a first input node coupled to a reference line via a first resistor, a second input node coupled to the second input node of the first amplifier, and a second output node coupled to the first input node of the first amplifier via a second resistor;
  a first feedback path coupled between the first input node of the second amplifier and the second output node; and
  a voltage clamping circuit coupled in parallel with the first feedback path, wherein the voltage clamping circuit is configured to clamp a voltage difference across the first feedback path.

12. The current sensing circuit of claim 11, wherein the first feedback path comprises a voltage divider, and the voltage divider is configured to divide the voltage difference across the first feedback path into a divided voltage difference, and apply the divided voltage difference across the second resistor to generate the protection current.

13. The current sensing circuit of claim 12, wherein the voltage divider comprises at least a third resistor and a fourth resistor coupled in series.

14. The current sensing circuit of claim 11, wherein the voltage clamping circuit comprises:
  a first diode of a first direction; and
  a second diode of a second direction opposite to the first direction and coupled in parallel with the first diode.

15. The current sensing circuit of claim 11, wherein the first amplifier further comprises:
  a second feedback path comprising an over-current protection device coupled between the first input terminal and the first output node of the first amplifier.

16. A current sensing circuit, comprising:
  a first input terminal and a second input terminal for introducing a subject current from a device coupled between the first and second input terminals;
  a first amplifier having a first input node coupled to the first input terminal via a protection resistor, a second input node coupled to the second input terminal, and a first output node coupled to the first input node via a capacitor, wherein the first amplifier has a current sensing path for sensing the subject current and converting the subject current into an output voltage that changes with the subject current; and
  a protection circuit coupled between the first and second input nodes of the first amplifier, wherein the protection circuit is configured to draw a protection current from the first input terminal through the protection resistor to at least partially offset the subject current,
  wherein the current sensing path comprises:
    a shunt resistor coupled between the second input node of the first amplifier and a reference line for generating the output voltage in response to the subject current; and
    an output terminal coupled to the second input node of the first amplifier, and configured to output the output voltage.

17. The current sensing circuit of claim 16, wherein the first amplifier further comprises a feedback path comprising an over-current protection device coupled between the first input terminal and the first output node of the first amplifier.

18. The current sensing circuit of claim 17, wherein the over-current protection device is a fuse.

19. The current sensing circuit of claim 18, wherein the fuse is a resettable fuse.

20. The current sensing circuit of claim 19, wherein the fuse is a positive temperature coefficient thermistor.

* * * * *